United States Patent

McEachern et al.

[11] Patent Number: 5,298,885
[45] Date of Patent: Mar. 29, 1994

[54] HARMONIC MEASURING INSTRUMENT FOR AC POWER SYSTEMS WITH POLY-PHASE THRESHOLD MEANS

[75] Inventors: Alexander McEachern, Oakland; Jamie Nicholson, Foster City, both of Calif.

[73] Assignee: Basic Measuring Instruments, Foster City, Calif.

[21] Appl. No.: 933,391

[22] Filed: Aug. 21, 1992

[51] Int. Cl.⁵ ............................................. G08B 21/00
[52] U.S. Cl. ..................................... 340/660; 340/662; 340/664; 364/483; 324/107
[58] Field of Search ......................... 340/557–663, 340/664; 324/76.12, 76.24, 76, 42, 141, 142, 107, 133, 542, 543, 539; 364/483, 484; 361/78, 113

[56] References Cited

U.S. PATENT DOCUMENTS

| | | |
|---|---|---|
| 4,612,617 | 9/1986 | Laplace, Jr. et al. ............... 364/483 |
| 4,709,339 | 11/1987 | Fernandes ............................ 364/492 |
| 4,868,704 | 9/1989 | Cavero ................................... 361/80 |
| 4,884,021 | 11/1989 | Hammond et al. . |
| 4,924,412 | 5/1990 | Leydier . |
| 4,931,725 | 6/1990 | Hutt et al. . |
| 4,933,869 | 6/1990 | Gareis et al. . |
| 4,964,055 | 10/1990 | Grassel et al. . |
| 4,977,513 | 10/1990 | LaPalme ............................... 364/483 |
| 5,059,896 | 10/1991 | Germer et al. . |
| 5,212,441 | 5/1993 | McEachern et al. ................. 324/142 |
| 5,224,054 | 6/1993 | Wallis ................................... 364/483 |

OTHER PUBLICATIONS

"IEEE Recommended Practices and Requirements for Harmonic Control in Electric Power Systems", Project IEEE-519/D7, Draft for Balloting dated Dec., 1990.

Primary Examiner—John K. Peng
Assistant Examiner—Tim Johnson
Attorney, Agent, or Firm—Haverstock, Medlen & Carroll

[57] ABSTRACT

An instrument for measuring voltage harmonics and current harmonics on AC (alternating current) power systems The instrument includes the ability to determine when threshold limits have been exceeded for harmonics. The instrument also includes timing thresholds whose inputs are activated when the harmonic thresholds are exceeded A single harmonic threshold is applied to measurements from multiple phases on polyphase systems by comparing the square root of the sum of the squares of measurements from each phase to the harmonic threshold. Three indicators show when voltage harmonic limits are exceeded, current harmonics limits are exceeded, or both voltage and current harmonic limits are exceeded simultaneously.

18 Claims, 4 Drawing Sheets

HARMONIC MEASURING INSTRUMENT FOR AC POWER SYSTEMS WITH POLY-PHASE THRESHOLD MEANS

FIELD OF THE INVENTION

This invention relates to instruments that measure voltage and current waveforms on AC (alternating current) power lines. More specifically, this invention relates to instruments that measure harmonic voltages and harmonic currents on AC power lines and then compare those measurements to thresholds.

BACKGROUND OF THE INVENTION

Electric power is ordinarily delivered to residences, commercial facilities, and industrial facilities as AC (alternating current) voltage that approximates a sine wave with respect to time, and ordinarily flows through a residence or facility as an AC current that also approximates a sine wave with respect to time. The electric power distribution system operates most efficiently and most safely when both the voltage and current are sine waves. However, certain kinds of loads draw current in a non-sinusoidal waveform, and, if, these loads are large relative to the distribution system source impedance, the system voltage can become non-sinusoidal as well.

These non-sinusoidal voltage and current waveforms may be conveniently expressed as a Fourier series (a sum of sinusoidal waveforms of varying frequency, amplitude, and phase angle). Under most circumstances, the Fourier series for AC power system voltage and currents consists of a fundamental frequency, typically 50 Hertz or 60 Hertz, plus integer multiples of the fundamental frequency. These integer multiples of the fundamental frequency are referred to as "harmonics".

Instruments for measuring AC power system voltage and current harmonics are well known to those skilled in the art. One such commercially available instrument is the model A PowerProfiler available from Basic Measuring Instruments, Foster City, Calif. Another commercially available instrument is the Model HP3588A Spectrum Analyzer available from the Hewlett Packard Corporation of Santa Clara, Calif. These instruments provide rapid, accurate assessment of the level of harmonic voltages and currents on an AC power system.

With the growing popularity of non-linear electric power loads such as adjustable speed drives, personal computers, and arc furnaces, it is often desirable to determine and record whether the level of voltage harmonics or current harmonics exceed some limit. As a general rule, the supplier of electricity is responsible for ensuring that the voltage harmonics are below some threshold, and the consumer of electricity is responsible for keeping harmonic currents below some other threshold. Harmonic thresholds are thus used to assign responsibility for eliminating voltage and current harmonics.

Table 1 below represents an example of a desired set of limits on voltage harmonics that apply to the provider of power. The Bus Voltage is measured at the point of common coupling (PCC) and the Total Harmonic Voltage Distortion (THD) is calculated as a percentage of the nominal fundamental frequency voltage.

TABLE 1

| Bus Voltage at PCC | Voltage Distortion Limits | |
|---|---|---|
| | Individual Harmonic Voltage Distortion (%) | Total Harmonic Voltage Distortion THD (%) |
| Below 69 kV | 3.0 | 5.0 |
| 69 kV to 138 kV | 1.5 | 2.5 |
| 138 kV and above | 1.0 | 1.5 |

Table 2 below represents an example of a desired set of limits on current harmonics that apply to the consumer of power. The Maximum Harmonic Current Distortion as a percentage of the maximum demand load current ($I_L$) at the fundamental frequency measured at the PCC is presented for odd harmonics in different ranges of the maximum short circuit current ($I_{SC}$) measured at the PCC divided by $I_L$. The column at the far right of the table represents the Total Demand Distortion (TDD) harmonic current distortion as a percentage of the maximum demand load current. The even harmonics are limited to 25% of the odd harmonic limits in the table.

TABLE 2

Current Distortion Limits
Maximum Harmonic Current Distortion in % of $I_L$
Harmonic Order (Odd Harmonics)

| $I_{SC}/I_L$ | <11 | 11 ≦ h < 17 | 17 ≦ h < 23 | 23 ≦ h < 35 | 35 ≦ h | TDD |
|---|---|---|---|---|---|---|
| <20 | 4.0 | 2.0 | 1.5 | 0.6 | 0.3 | 5.0 |
| 20 < 50 | 7.0 | 3.5 | 2.5 | 1.0 | 0.5 | 8.0 |
| 50 < 100 | 10.0 | 4.5 | 4.0 | 1.5 | 0.7 | 12.0 |
| 100 < 1000 | 12.0 | 5.5 | 5.0 | 2.0 | 1.0 | 15.0 |
| >1000 | 15.0 | 7.0 | 6.0 | 2.5 | 1.4 | 20.0 |

Commercially available instruments such as the Basic Measuring Instruments model 3030A can be equipped with a feature that allows a user to program a threshold for a voltage harmonic, and program a second threshold for a current harmonic, then receive an alarm if these thresholds are exceeded. However, these independent thresholds fail to take into account the fact that increased harmonic currents may cause increased harmonic voltages. Consequently, independent voltage and current harmonic thresholds are not optimal for assigning responsibility for harmonic problems.

Commercially available power system harmonic instruments, such as the Basic Measuring Instruments model 3030A and the Model 8000 power Analyzer available from Dranetz Technologies of Edison, N.J., apply each harmonic threshold independently to each phase on poly-phase systems. For example, if the user selects a 4% threshold on the fifth current harmonic, these instruments will sound an alarm if the fifth current harmonic on Phase A of a three phase system exceeds 4%, or if the fifth current harmonic on Phase B of a three phase system exceeds 4%, or if the fifth current harmonic on Phase C of a three phase system exceeds 4%. This method of applying harmonic thresholds fails to accurately assess the physical impact of the harmonic levels on polyphase distribution systems.

Commercially available instruments such as the BMI Model 3030A and the Dranetz Technologies Model 8000 offer the ability to chart harmonic levels over time. This approach is useful for analyzing a harmonic problem; however, it cannot provide a yes or no answer to the question: does this measurement location have a harmonics problem? Simpler instruments, such as the one disclosed by Grassel et al. in U.S. Pat. 4,964,055, offer the ability to take a snapshot of harmonic levels. Although this method can provide a yes or no answer to the question posed above for one instant in time, harmonic levels typically fluctuate widely with time of day, types of loads turned on, and other factors, so it cannot provide an answer over a period of time.

It is an object of this invention to provide a simple, direct indication of whether there is a harmonics problem at a measurement location that takes into account the variation in harmonic levels over time. It is a further object of this invention to apply harmonics thresholds to poly-phase power systems in a way that more accurately reflects the physical impact of harmonics on AC power distribution systems. It is a further object of this invention to apply harmonic thresholds to AC power systems in a way that acknowledges that increased harmonic currents can cause increased harmonic voltages.

SUMMARY OF THE INVENTION

An instrument for measuring voltage harmonics and current harmonics on AC (alternating current) power systems. The instrument includes the ability to determine when threshold limits have been exceeded for harmonics. The instrument also includes timing thresholds whose inputs are activated when the harmonic thresholds are exceeded. A single harmonic threshold is applied to measurements from multiple phases on polyphase systems by comparing the square root of the sum of the squares of measurements from each phase to the harmonic threshold. Three indicators show when voltage harmonic limits are exceeded, current harmonics limits are exceeded, or both voltage and current harmonic limits are exceeded simultaneously.

DETAILED DESCRIPTION OF A PREFERRED EMBODIMENT

Figure 1:
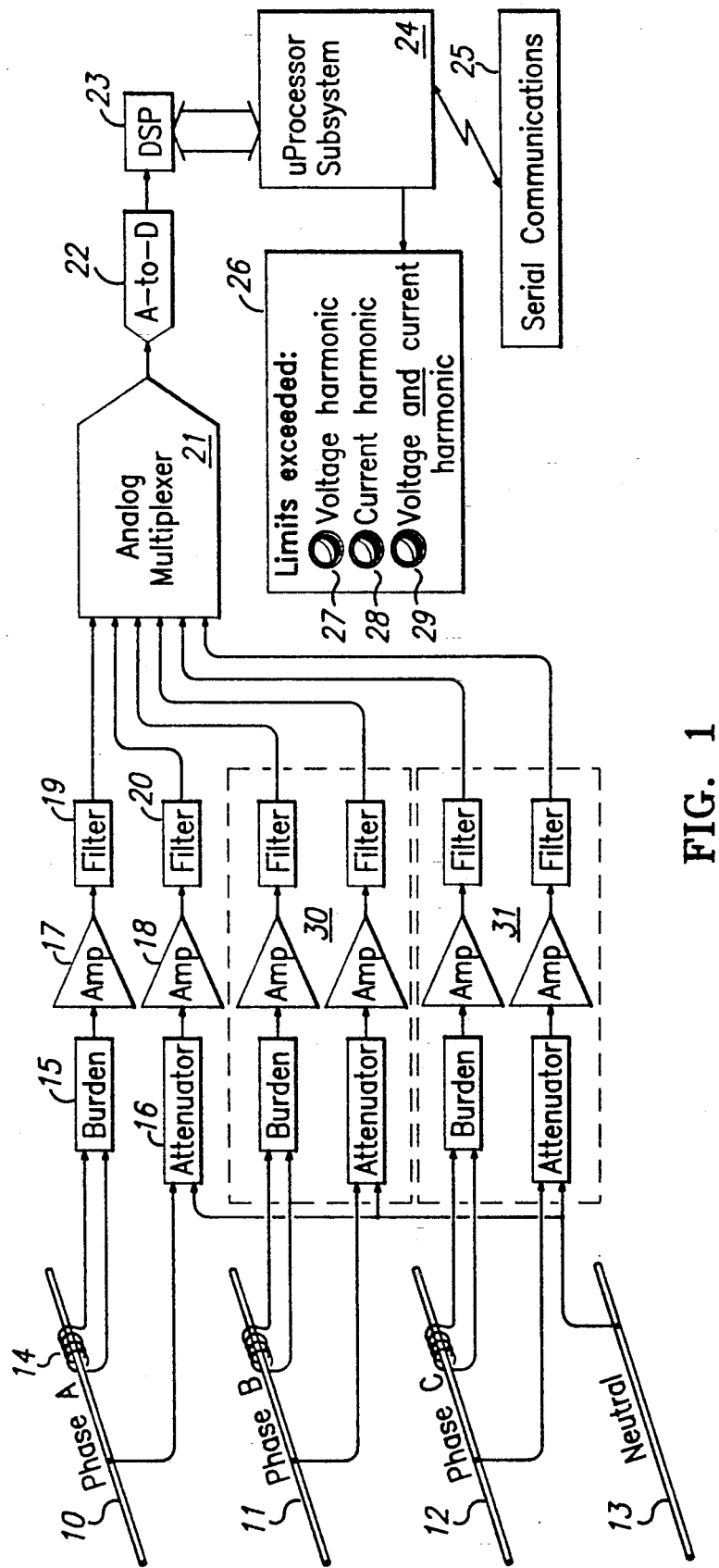
FIG. 1 shows a block diagram of the preferred embodiment of the invention.

FIG. 1 shows a block diagram of a preferred embodiment of the invention. Three-phase power flows on power system conductors 10,11,12,13 from a supplier, such as an electric utility company, to a consumer, such as a building. Coupled to the Phase A conductor 10 are a current transformer 14 and an associated burden resistor 15 which together produce a voltage at an appropriate level for further processing that is proportional to the current flowing in the Phase A conductor 10. The voltage attenuator 16 reduces the voltage difference observed between the Phase A conductor 10 and the Neutral conductor 13 to a level appropriate for further processing. The outputs of the burden resistor 15 and the attenuator 16 are coupled to the amplifiers 17, 18 which adjust the amplitudes of the respective signals. The output of each one of the amplifiers 17,18 is connected to one of the low-pass filters 19,20, respectively which remove undesired frequencies from the signals.

The functions performed for Phase A 10 by its associated circuits 15,16,17,18,19,20 are performed identically for Phase B by its associated circuits 30 and for Phase C by its associated circuits 31. The filtered voltage and current signals from each phase are delivered to a multiplexer 21, which presents each signal in turn to an A-to-D (Analog-to-Digital) converter 22. The A-to-D converter 22 uses well-known techniques to convert the analog voltage and current signals to regularly-sampled digital time-domain representations of the signals. These time-domain representations are passed to a DSP (Digital Signal Processor) 23, which converts them to frequency-domain representations which are in turn passed to a Microprocessor Subsystem 24. It will be apparent to a person of ordinary skill in the art that the time-domain signals can be passed directly from the Aa-to-D converter 22 to the Microprocessor Subsystem 24 without using a DSP 23. In such systems, the Microprocessor Subsystem 24 can be conditioned to perform the conversion of the signals to the frequency-domain.

Using techniques described further below, the Microprocessor Subsystem 24 applies thresholds to the harmonics observed in the frequency domain representations then determines whether any of the thresholds have been exceeded. If any thresholds have been exceeded, the Microprocessor Subsystem 24 communicates the event through the Serial Communications port 25 and illuminates the appropriate latched indicator in its display 26.

For a single-phase power system having a power line conductor and a power neutral conductor the same instrument can be used, but with Phase B and Phase C and their associated circuits disconnected or a simpler instrument which does not include the circuitry required for Phase B and Phase C can be used. The analog multiplexer can also be used with a single phase power system or it can be replaced with a second A-to-D converter such that the first A-to-D converter is coupled between the filter 19 and the DSP 23 and the second A-to-D converter is coupled between the filter 20 and the DSP 23. The DSP 23 will then still convert the voltage and current signals of the power line from time-domain representations to frequency-domain representations.

In a preferred embodiment, the Attenuator 16 is a resistive attenuator with a ratio of 120:1; the current transformer 14 and its associated burden resistor 15 provide an output of 1 volt per 100 amps; the amplifier blocks 17,18 provide a gain of 31; the filter blocks 19,20 implement a 4-pole Butterworth low-pass filter with a corner frequency of 4 kiloHertz; the analog multiplexer 21 is a model AD7506 available from Analog Devices of Norwood, Mass.; the A-to-D converter 22 is a model AD574 also available from Analog Devices, sampling at 100 microsecond intervals; the DSP 23 is a model TMS320C10 available from Texas Instruments of Dallas, Tex.; the Microprocessor Subsystem 24 and the Serial Communications port 25 are based on a model 80186 microprocessor available from the Intel Corporation of Santa Clara, Calif. and supported by standard logic and timing circuits well known to persons familiar with the art; and the display 26 comprises three standard light-emitting diodes 27,28,29 operating in the visible spectrum. These values and specifications are given solely to illustrate one possible implementation of the invention which is defined fully by the appended claims and those claims in U.S. patent application Ser. No. 07/933,391 filed on Aug. 21, 1992 and U.S. patent application Ser. No. 07/934,355 filed on Aug. 21, 1992.

Figure 2:
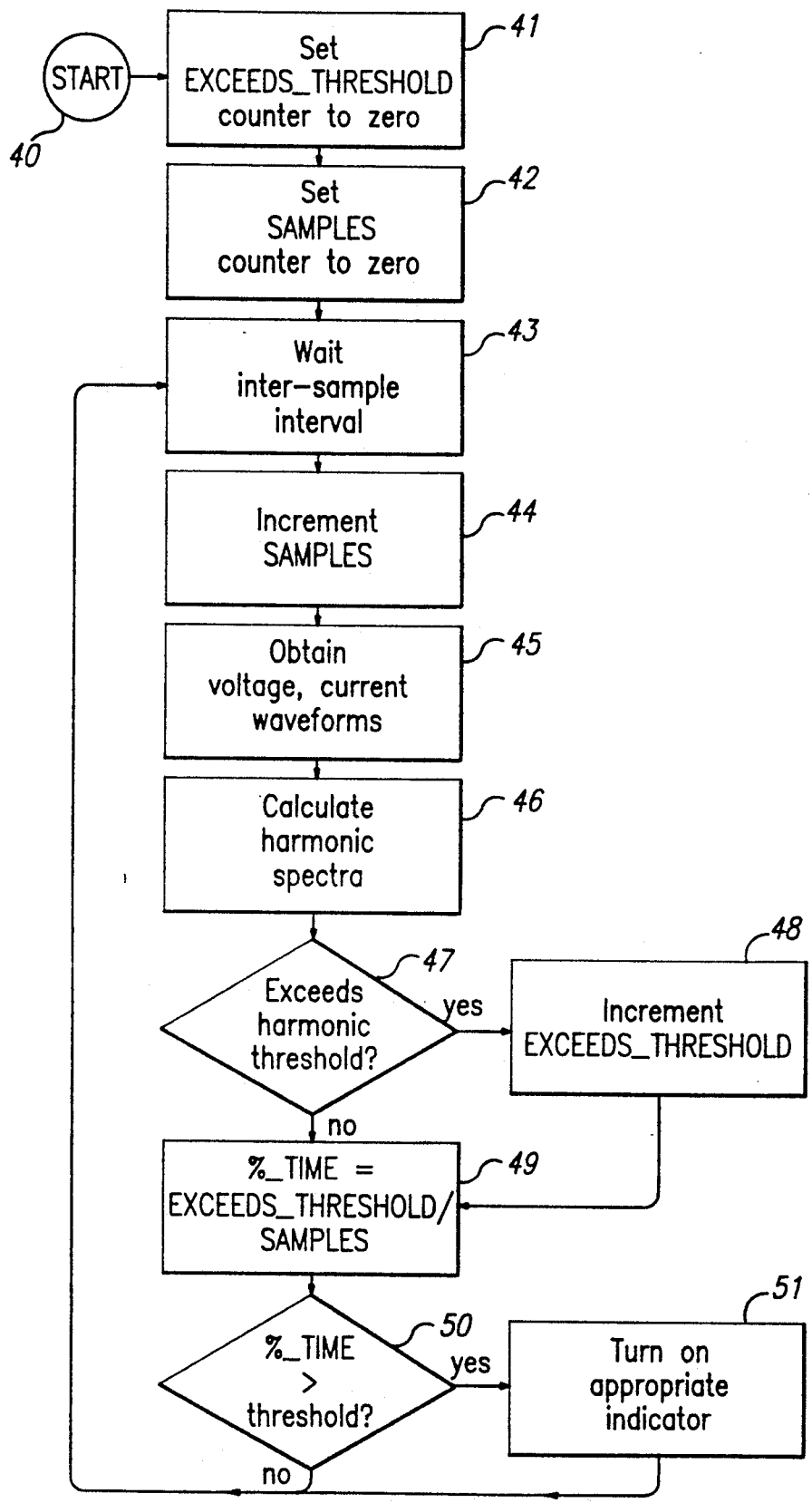
FIG. 2 shows a flow diagram of a key algorithm of the invention.

FIG. 2 illustrates an algorithm that is implemented by the Microprocessor Subsystem 24 and associated DSP 23 beginning at the Block 40. In the preferred embodiment, there are fifty-one voltage and current harmonic parameters of interest, including THD (total harmonic distortion) and each individual harmonic through the fiftieth. Each harmonic and THD is resolved by the same algorithm. It should be understood to a person of ordinary skill that these harmonic values can be resolved sequentially using the same hardware (at the expense of time) or concurrently (at the expense of circuitry) depending upon the requirements of the application being solved. For simplicity, the following description assumes that there is a single voltage harmonic parameter of interest and a single current harmonic parameter of interest. These same descriptions would apply equally well to the remaining fifty voltage and current harmonic parameters of interest, including THD.

In the algorithm, the Microprocessor Subsystem 24 takes data from the DSP concerning the voltage and current harmonics of the power system and determines if any of those harmonics exceed a threshold as programmed from the tables discussed earlier. When the algorithm begins, the Block 41 sets the EXCEEDS_THRESHOLD counter to zero and the Block 42 sets the SAMPLES counter to zero.

The Block 43 then enters a wait loop for a predetermined inter-sample interval and when that interval has elapsed the Block 44 increments the SAMPLES counter. The Blocks 45 and 46 are executed by the DSP 23. The Block 45 obtains the data concerning the voltage and current time-domain waveforms of the power system. If the system is a poly-phase system then the voltage and current waveforms of each phase in turn are presented to the A-to-D converter 22 by the multiplexer 21 and then to the DSP 23. If the system is a single phase system the voltage and current waveforms of the power system are converted using either a multiplexer and one A-to-D converter or two A-to-D converters. At Block 46, the digital time-domain waveforms are then processed by the DSP 23 in order to convert them to frequency-domain representations. The harmonics in the frequency-domain spectra are passed from the DSP 23 to the Microprocessor subsystem 24, which continues execution at the Block 47.

The Block 47 then determines if this harmonic exceeds a predetermined threshold. If the harmonic does exceed a predetermined threshold the Block 48 increments the EXCEEDS_THRESHOLD counter. The Blocks 47 and 48 will be discussed in more detail subsequently. Control is then passed to the Block 49 where a value, %_TIME, is calculated by dividing the value in the EXCEEDS_THRESHOLD counter by the value in the SAMPLES counter and the result is then stored in the %_TIME register. If the Block 47 determines that the harmonic spectra does not exceed any predetermined threshold then control is passed directly to the Block 49 bypassing the Block 48.

The Block 50 next determines if the value stored in the %_TIME register exceeds a predetermined threshold for an amount of time the predetermined harmonic threshold has been exceeded. If the predetermined threshold is exceeded by the value in the %_TIME register then the Block 51 lights up the appropriate latched indicator light 27,28,29 and control is passed back to the beginning of the loop at the Block 43. If the predetermined threshold is not exceeded by the value in the %_TIME register then the Block 51 is bypassed and control is passed back to the beginning of the loop at the Block 43.

The preferred embodiment of the invention allows the indicators to be conditioned depending upon the desire of the user. In particular, the indicators can trigger if the respective harmonic thresholds are exceeded for an instant. Similarly, the indicators can be conditioned to trigger if a time threshold for the average time or percentage of time that the harmonic thresholds are exceeded is also exceeded. In such circumstances the indicators will not trigger if the harmonic thresholds are merely exceeded momentarily. Lastly, the apparatus can be conditioned to operate with a rolling percentage trigger. This means that period for the percentage or average time that the harmonic thresholds are exceeded has a constant length but a continually new starting time. This prevents the minimizing effect of a longer time period over which the percentage or average is taken.

Figure 3:
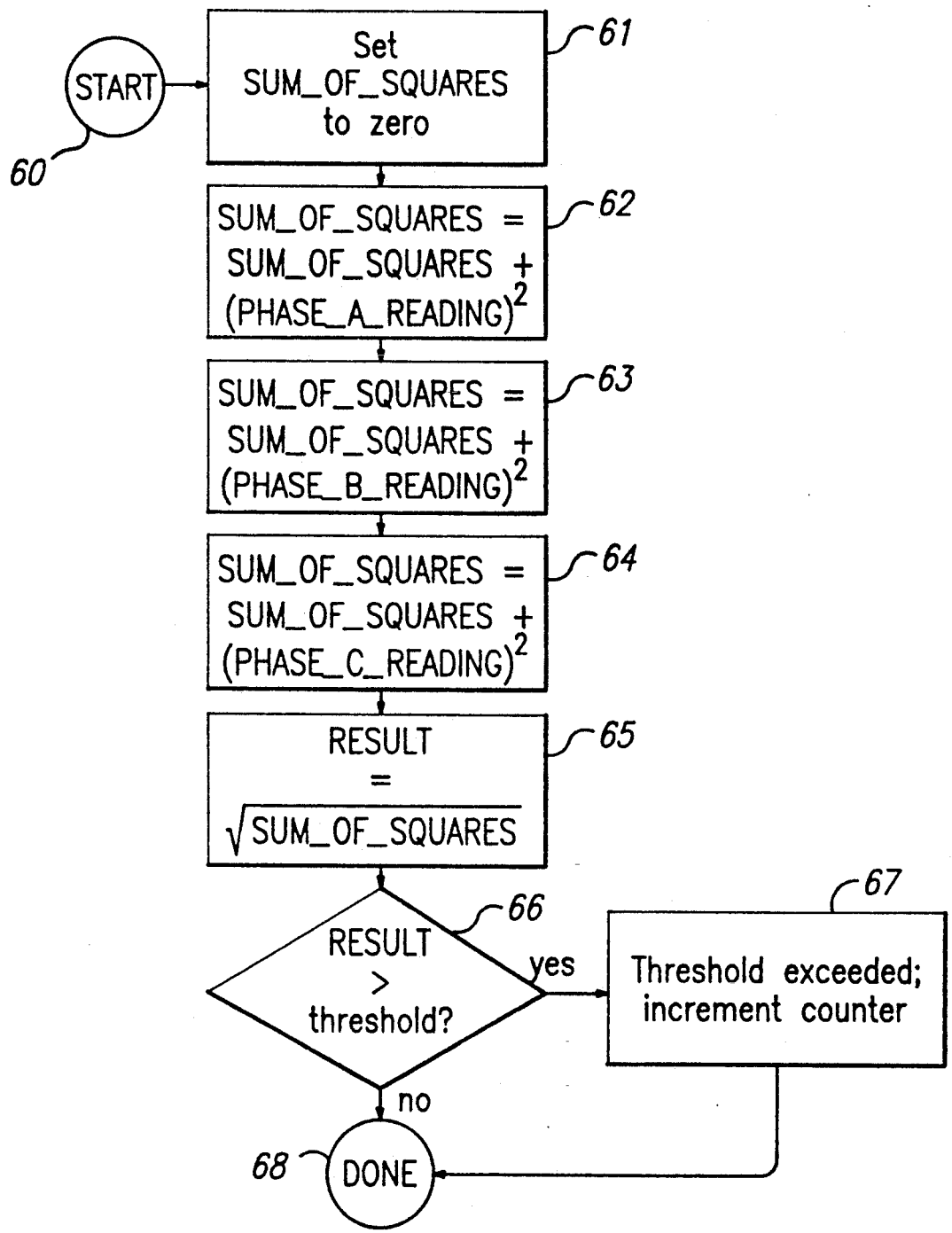
FIG. 3 shows a flow diagram that expands Blocks 47 and 48 of FIG. 2.

FIG. 3 illustrates a flow diagram that expands the Blocks 47 and 48. This subroutine begins at the Block 60. The Block 61 sets a SUM_OF_SQUARES register to zero. The Block 62 first squares the value received by the Microprocessor Subsystem 24 from the Phase A conductor 10 and then adds that value to the SUM_OF_SQUARES register and stores the result in the SUM_OF_SQUARES register. The Block 63 then squares the value received from the Phase B conductor 11 and adds that value to the SUM_OF_SQUARES register and stores the result in the SUM_OF_SQUARES register. The Block 64 then squares the value received from the Phase C conductor 12 and adds that value to the SUM_OF_SQUARES register and stores the result in the SUM_OF_SQUARES register. If only a single phase power system is being monitored, the Blocks 63 and 64 are bypassed.

The Block 65 then calculates the square root of the value stored in the SUM_OF_SQUARES register and stores the result in a RESULT register. The Block 66 then determines if the value stored in the RESULT register exceeds a predetermined threshold. If the value stored in the RESULT register does exceed the predetermined threshold, the Block 67 increments the EXCEEDS_THRESHOLD counter and control is passed to the Block 68. If the value stored in the RESULT register does not exceed the predetermined threshold, the Block 67 is bypassed and control is passed directly to the Block 68. The Block 68 then passes control back to the main algorithm and the Block 49.

Figure 4:
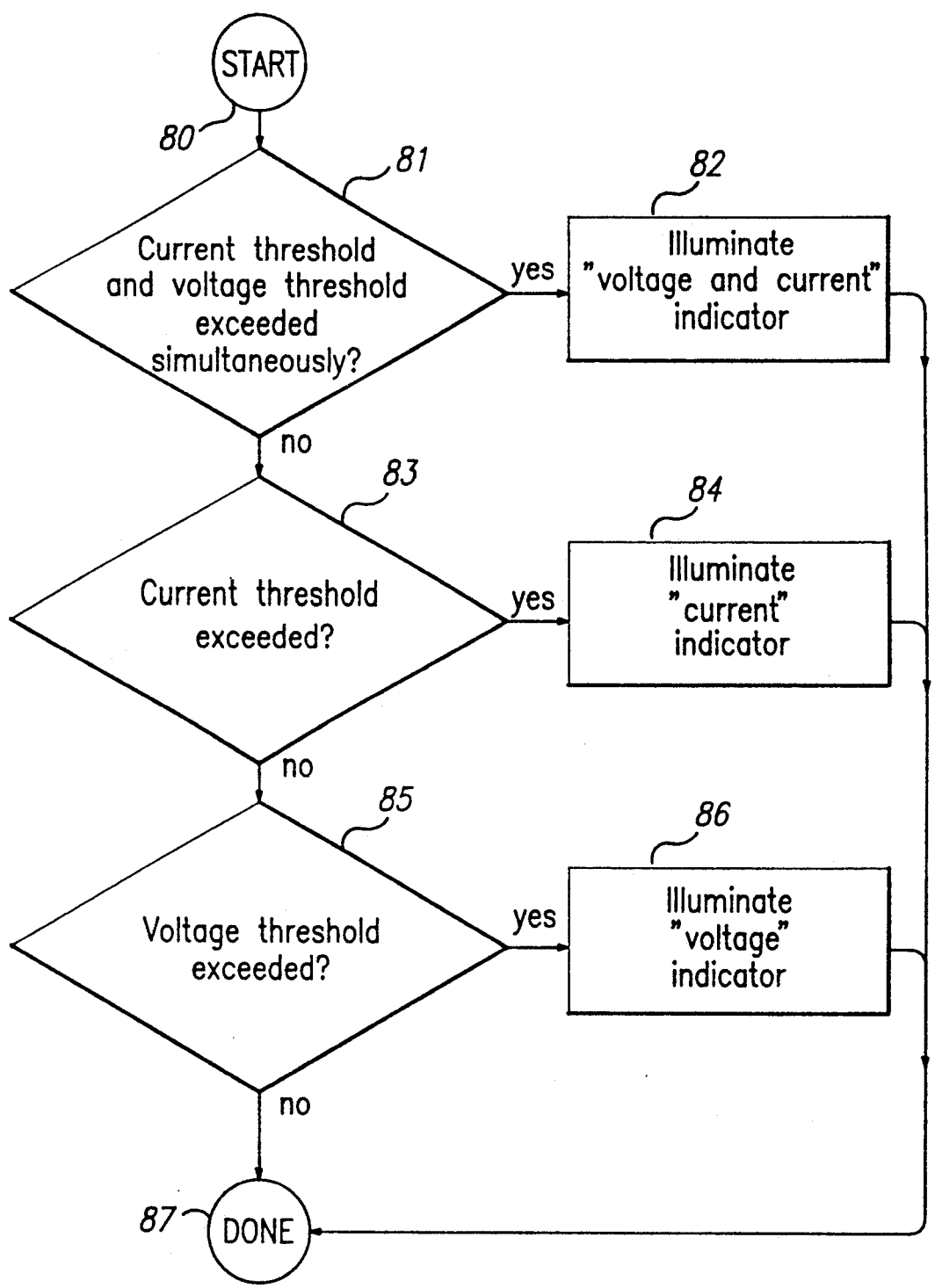
FIG. 4 shows a flow diagram that expands Blocks 50 and 51 of FIG. 2.

FIG. 4 illustrates a flow diagram that expands the Blocks 50 and 51. This subroutine begins at the Block 80. The Block 81 determines if both the predetermined current and voltage thresholds are exceeded simultaneously. If the predetermined current and voltage thresholds are exceeded simultaneously the Block 82 illuminates the "voltage and current" indicator 29 and control is passed to the Block 87. Otherwise, the Block 83 determines if the predetermined current threshold has been exceeded. If the predetermined current threshold has been exceeded the Block 84 illuminates the "current" indicator 28 and control is passed to the Block 87. Otherwise, the Block 85 determines if the predetermined voltage threshold has been exceeded. If the predetermined voltage threshold has been exceeded the Block 86 illuminates the "voltage" indicator 27. Otherwise, control is then passed to the Block 87 which then passes control back to the Block 43 of the main algorithm.

As a general rule, if the "voltage" indicator 27 lights up then the voltage harmonics are above a threshold and are the responsibility of the supplier of electricity. If the "current" indicator 28 lights up then the current harmonics are above a threshold and are the responsibility of the consumer of electricity. If the "voltage and current" indicator 29 lights up then both the voltage harmonics and the current harmonics are above their respective thresholds and should be the responsibility of the consumer of electricity because the increased harmonic currents may have caused the increased harmonic voltages.

Accordingly, the present invention provides a first indicator for signalling that the power supplied by the utility exceeds a predetermined threshold for harmonics. In this situation, the utility must resolve the deficiency. A second indicator provides notification that the power consumer has caused harmonics on the power lines which exceed the predetermined threshold. Here, the power consumer must resolve the deficiency. In addition, a third indicator is provided which signals that the harmonics exceed the threshold because both the power consumer has caused harmonics in excess of the threshold and the utility has provided power with excess harmonics. In this case, the power consumer must first correct its deficiencies because its introduction of harmonics may be the cause of the inadequate power by the utility.

For the third indicator to light, the power supplied by the utility exceeds the predetermined threshold and the power consumer has caused harmonics on the power lines simultaneously. This is because there can be no correlation between these two conditions unless the events occur at the same time. If the events happen at different times it is unlikely that the harmonics on the power lines caused by the consumer could have caused the utility to provide deficient power.

The present invention can be used by both the supplier of electricity and the consumer of electricity to prevent and control voltage and current harmonics. The supplier can assess responsibility and cost according to who is responsible for the harmonics that may occur and the consumer can prevent damage to its equipment and machinery by controlling the harmonics and gaining knowledge of when they occur. Various modifications may be made to the preferred embodiment without departing from the spirit and scope of the invention as defined by the appended claims.

What is claimed is:

1. An apparatus for measuring voltage harmonics and current harmonics on a poly-phase alternating current power system comprising:
   a. means for sensing a plurality of harmonic voltage parameters on each phase coupled to the poly-phase alternating current power systems;
   b. means for determining when one of the plurality of harmonic voltage parameters exceeds a predetermined voltage threshold coupled to the means for sensing a plurality of harmonic voltage parameters;
   c. means for sensing a plurality of harmonic currents on each phase coupled to the poly-phase alternating current power system;
   d. means for determining when one of the plurality of the harmonic currents exceeds a predetermined current threshold coupled to the means for sensing a plurality of harmonic currents;
   e. means for indicating when either the predetermined voltage threshold is exceeded, the predetermined current threshold is exceeded or both the predetermined voltage threshold and the predetermined current threshold are exceeded simultaneously, the means for indicating coupled to the means for determining when one of the plurality of harmonic voltage parameters exceeds a predetermined voltage threshold and to the means for determining when one of the plurality of the harmonic currents exceeds a predetermined current threshold.

2. The apparatus as claimed in claim 1 wherein the poly-phase alternating current power system comprises a first phase conductor, a second phase conductor, a third phase conductor and a neutral phase conductor and wherein the means for sensing a plurality of harmonic voltage parameters comprises a first attenuator coupled to the first phase conductor, a second attenuator coupled to the second phase conductor and a third attenuator coupled to the third phase conductor for sensing a voltage difference between each phase conductor and the neutral conductor.

3. The apparatus as claimed in claim 2 wherein the means for sensing a plurality of harmonic currents comprises a first current transformer and a first burden resistor both coupled to the first phase conductor, a second current transformer and a second burden resistor both coupled to the second phase conductor and a third current transformer and a third burden resistor both coupled to the third phase conductor each for sensing the current flowing through each phase conductor.

4. The apparatus as claimed in claim 1 wherein the poly-phase alternating current power system comprises a plurality of phase conductors and a neutral conductor, wherein the means for sensing a plurality of harmonic voltage parameters comprises an attenuator coupled between each one of the plurality of phase conductors and the neutral conductor for sensing a voltage difference therebetween.

5. The apparatus as claimed in claim 4 wherein the means for sensing a plurality of harmonic currents comprises a plurality of current transformers and a plurality of burden resistors, one of the plurality of current transformers and one of the plurality of burden resistors coupled to a respective one of the plurality of each for sensing the current flowing through each phase conductor.

6. The apparatus as claimed in claim 1 further comprising a means for communicating when either the predetermined voltage threshold is exceeded, the predetermined current threshold is exceeded or both the predetermined voltage threshold and the predetermined current threshold are exceeded, the means for communicating coupled to the means for determining when one of the plurality of harmonic voltage parameters exceeds a predetermined voltage threshold and to the means for determining when one of the plurality of the harmonic currents exceeds a predetermined current threshold.

7. The apparatus as claimed in claim 1 wherein the means for indicating comprises:
   a. a first indicator light for indicating when one of the harmonic voltage parameters exceeds the predetermined voltage threshold;
   b. a second indicator light for indicating when one of the harmonic parameters current exceeds the predetermined current threshold; and
   c. a third indicator light for indicating when both one of the harmonic voltage parameters exceeds the predetermined voltage threshold and one of the harmonic current parameters exceeds the predetermined current threshold.

8. The apparatus as claimed in claim 5 wherein the means for determining when one of the plurality of harmonic voltages exceeds a predetermined voltage threshold comprises a microprocessor subsystem which calculates the square root of the sum of the squares of the harmonic voltages on each phase and compares the result to the predetermined voltage threshold.

9. The apparatus as claimed in claim 8 wherein the means for determining when one of the plurality of harmonic currents exceeds a predetermined current threshold comprises the microprocessor subsystem which calculates the square root of the sum of the squares of the harmonic currents on each phase and compares the result to the predetermined current threshold.

10. An apparatus for measuring voltage harmonics and current harmonics on a poly-phase alternating current power system having a phase A conductor, a phase B conductor, a phase C conductor and a neutral conductor, said apparatus comprising:
   a. a first means for sensing a harmonic voltage and a harmonic current coupled to the phase A conductor and the neutral conductor;
   b. a second means for sensing a harmonic voltage and a harmonic current coupled to the phase B conductor and the neutral conductor;
   c. a third means for sensing a harmonic voltage and a harmonic current coupled to the phase C conductor and the neutral conductor;
   d. a first means for calculating the square root of the sum of the squares of the harmonic voltages on each phase and storing the result as a value in a first register, the first means for calculating coupled to the first, second and third means for sensing;
   e. a second means for calculating the square root of the sum of the squares of the harmonic currents on each phase and storing the result as a value in a second register, the second means for calculating coupled to the first, second and third means for sensing;
   f. a first means for determining when the value stored in the first register exceeds a predetermined voltage threshold, the first means for determining coupled to the first means for calculating and to the first register;
   g. a second means for determining when the value stored in the second register exceeds a predetermined current threshold, the second means for determining coupled to the second means for calculating and to the second register; and
   h. means for indicating when either the predetermined voltage threshold is exceeded, the predetermined current threshold is exceeded or both the predetermined voltage threshold and the predetermined current threshold are exceeded, the means for indicating coupled to the first and second means for determining.

11. The apparatus as claimed in claim 10 further comprising means for communicating when either the predetermined voltage threshold is exceeded, the predetermined current threshold is exceeded or both the predetermined voltage threshold and the predetermined current threshold are exceeded, the means for communicating coupled to the first and second means for determining.

12. The apparatus as claimed in claim 11 wherein the means for indicating comprises:
   a. a first indicator light for indicating when the harmonic voltage exceeds the predetermined voltage threshold;
   b. a second indicator light for indicating when the harmonic current exceeds the predetermined current threshold; and
   c. a third indicator light for indicating when both the harmonic voltage exceeds the predetermined voltage threshold and the harmonic current exceeds the predetermined current threshold.

13. An apparatus for measuring voltage harmonics and current harmonics on a poly-phase alternating current power system having a phase A conductor, a phase B conductor, a phase C conductor and a neutral conductor, said apparatus comprising:
   a. a first current transformer coupled to the phase A conductor;
   b. a first burden resistor coupled to the first current transformer for producing a first voltage signal which represents a current flowing in the phase A conductor;
   c. a first amplifier coupled to the first burden resistor for adjusting the first voltage signal;
   d. a first filter coupled to the first amplifier for removing undesired frequencies from the first voltage signal;
   e. a first attenuator coupled to the phase A conductor and the neutral conductor for receiving a second voltage signal which represents a voltage difference between the phase A conductor and the neutral conductor;
   f. a second amplifier coupled to the first attenuator for adjusting the second voltage signal;
   g. a second filter coupled to the second amplifier for removing undesired frequencies from the second voltage signal;
   h. a second current transformer coupled to the phase B conductor;
   i. a second burden resistor coupled to the second current transformer for producing a third voltage signal which represents a current flowing in the phase B conductor;
   j. a third amplifier coupled to the second burden resistor for adjusting the third voltage signal;
   k. a third filter coupled to the third amplifier for removing undesired frequencies from the third voltage signal;
   l. a second attenuator coupled to the phase B conductor and the neutral conductor for receiving a fourth voltage signal which represents a voltage difference between the phase B conductor and the neutral conductor;
   m. a fourth amplifier coupled to the second attenuator for adjusting the fourth voltage signal;
   n. a fourth filter coupled to the fourth amplifier for removing undesired frequencies from the fourth voltage signal;
   o. a third current transformer coupled to the phase C conductor;
   p. a third burden resistor coupled to the third current transformer for producing a fifth voltage signal which represents a current flowing in the phase C conductor;
   q. a fifth amplifier coupled to the third burden resistor for adjusting the fifth voltage signal;

r. a fifth filter coupled to the fifth amplifier for removing undesired frequencies from the fifth voltage signal;

s. a third attenuator coupled to the phase C conductor and the neutral conductor for receiving a sixth voltage signal which represents a voltage difference between the phase C conductor and the neutral conductor;

t. a sixth amplifier coupled to the third attenuator for adjusting the sixth voltage signal;

u. a sixth filter coupled to the sixth amplifier for removing undesired frequencies from the sixth voltage signal;

v. an analog multiplexer having a plurality of inputs and an output, said inputs coupled to the first filter, the second filter, the third filter, the fourth filter, the fifth filter and the sixth filter for outputting the first, second, third, fourth, fifth and sixth voltage signals one at a time, each in turn;

w. an analog-to-digital converter having an input and an output, the input coupled to the output of the analog multiplexer for receiving the first, second, third, fourth, fifth and sixth voltage signals each in turn and outputting them as a regularly sampled digital time-domain representation;

x. a digital signal processing circuit having an input and an output, the input coupled to the output of the analog-to-digital converter for converting the regularly sampled digital time-domain representation received from the analog-to-digital converter into a frequency-domain representation having a plurality of harmonics;

y. a microprocessor subsystem coupled to the output of the digital signal processing circuit for grouping the harmonics received from the digital signal processing circuit into a first group and a second group, the first group representing the voltage difference between each phase and the neutral conductor and the second group representing the current flowing in each phase conductor and for determining if any of the harmonics received from the digital signal processing circuit exceed a predetermined threshold;

z. a display coupled to the microprocessor subsystem for indicating if any of the frequency-domain representations do exceed a predetermined threshold.

14. The apparatus according to claim 13 wherein the digital signal processing circuit is a microprocessor.

15. The apparatus according to claim 13 wherein the digital signal processing circuit is the microprocessor.

16. The apparatus as claimed in claim 13 wherein the microprocessor subsystem determines if any of the harmonics received from the digital signal processing circuit exceed a predetermined threshold by calculating the square root of the sum of the squares of the harmonics in the first group and compares the result to a predetermined voltage threshold and by calculating the square root of the sum of the square of the harmonics in the second group and compares the result to a predetermined current threshold.

17. The apparatus as claimed in claim 16 wherein the display comprises:

a. a first indicator light for indicating when the predetermined voltage threshold has been exceeded;

b. a second indicator light for indicating when the predetermined current threshold has been exceeded; and c. a third indicator light for indicating when both the predetermined voltage threshold and the predetermined current threshold have been exceeded.

18. The apparatus as claimed in claim 17 further comprising a serial communications port coupled to the microprocessor subsystem for communicating when any of the predetermined thresholds have been exceeded.

* * * * *

UNITED STATES PATENT AND TRADEMARK OFFICE
CERTIFICATE OF CORRECTION

PATENT NO. : 5,298,885
DATED : 03/29/94
INVENTOR(S) : McEachern et al.

It is certified that error appears in the above-identified patent and that said Letters Patent is hereby corrected as shown below:

In column 4, line 46, please replace "31" with --3--.

In column 6, lines 24 - 25, please replace "O-F" with --OF--..

In column 6, lines 30 - 31, please replace "S-QUARES" with --SQUARES--.

Signed and Sealed this

Fifth Day of July, 1994

Attest:

BRUCE LEHMAN

Attesting Officer

Commissioner of Patents and Trademarks